US 9,087,926 B2

(12) United States Patent
Snyder

(10) Patent No.: US 9,087,926 B2
(45) Date of Patent: Jul. 21, 2015

(54) LOW CAPACITANCE SEMICONDUCTOR DEVICE

(75) Inventor: Rick D. Snyder, Windsor, CO (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 1079 days.

(21) Appl. No.: 12/646,324

(22) Filed: Dec. 23, 2009

(65) Prior Publication Data

US 2011/0147894 A1    Jun. 23, 2011

(51) Int. Cl.
| | |
|---|---|
| H01L 23/29 | (2006.01) |
| H01L 29/868 | (2006.01) |
| H01L 23/31 | (2006.01) |
| H01L 29/66 | (2006.01) |
| H01L 29/872 | (2006.01) |
| H01L 29/06 | (2006.01) |

(52) U.S. Cl.
CPC .......... *H01L 29/868* (2013.01); *H01L 23/3171* (2013.01); *H01L 29/66136* (2013.01); *H01L 29/66143* (2013.01); *H01L 29/872* (2013.01); H01L 23/291 (2013.01); H01L 29/0657 (2013.01); H01L 2924/0002 (2013.01)

(58) Field of Classification Search
CPC .................................................... H01L 23/291
USPC ....................................................... 257/728
See application file for complete search history.

(56) References Cited

U.S. PATENT DOCUMENTS

| | | | | |
|---|---|---|---|---|
| 6,153,921 A * | 11/2000 | Aoki et al. | .................... | 257/656 |
| 6,228,673 B1 * | 5/2001 | Loo et al. | ......................... | 438/57 |
| 6,310,394 B1 | 10/2001 | Anand et al. | | |
| 6,780,532 B2 | 8/2004 | Yang et al. | | |
| 6,821,860 B1 | 11/2004 | Behammer | | |
| 7,346,090 B2 | 3/2008 | Johnson et al. | | |
| 2001/0016377 A1 * | 8/2001 | Mizutani | ....................... | 438/167 |
| 2004/0022025 A1 * | 2/2004 | Yokogawa et al. | ........... | 361/695 |
| 2005/0280114 A1 * | 12/2005 | Singh | ............................ | 257/502 |
| 2006/0205129 A1 | 9/2006 | Sato et al. | | |
| 2006/0220086 A1 * | 10/2006 | Charbuillet et al. | .......... | 257/296 |
| 2007/0176252 A1 * | 8/2007 | Coolbaugh et al. | ........... | 257/458 |
| 2008/0197360 A1 * | 8/2008 | Sriram et al. | .................. | 257/77 |

OTHER PUBLICATIONS

W.L. Bishop et al., "A Micron-Thickness, Planar Schottky Diode Chip for Terahertz Applications With Theoretical Minimum Parasitic Capacitance", Microwave Symposium Digest, 1990., IEEE MTT-S International, May 8-10, 1990, vol. 3, pp. 1305-1308.

(Continued)

*Primary Examiner* — Matthew Reames

(57) ABSTRACT

A semiconductor device includes a diode, a passivation layer and a conductive layer. The diode includes an epitaxial layer on a semiconductor substrate, and first and second diode contacts on different planes. The passivation layer has a planar top surface, and includes multiple consecutive layers of a benzocyclobutene (BCB) material formed on the diode, an aggregate thickness of the passivation layer exceeding a thickness of the epitaxial layer. The conductive layer is formed on the top surface of passivation layer, the conductive layer connecting with the first and the second diodes contact through first and second openings in the passivation layer, respectively. The passivation layer enhances a capacitive isolation between the conductive layer and the diode.

20 Claims, 9 Drawing Sheets

(56) References Cited

OTHER PUBLICATIONS

I-Hsing Tan et al., "120-GHz Long-Wavelength Low-Capacitance Photodetector with an Air-Bridged Coplanar Metal Waveguide,", IEEE Photonics Technology Letters, vol. 7, Issue 12, Dec. 1995, pp. 1477-1479.

T.M. Stokich et al., "Planarization With Cyclotene 3022 (BCB) Polymer Coatings", 1993 Materials Research Society, vol. 308, pp. 517-526.

* cited by examiner

LOW CAPACITANCE SEMICONDUCTOR DEVICE

BACKGROUND

Various types of semiconductor diodes, such as varactor and Schottky diodes, are used in radio frequency (RF) circuits, including RF receivers. For efficient operation of the RF circuits, parasitic capacitance of the diodes must be minimized, particularly in devices having high frequency responses. For example, a diode formed on a silicon substrate over an active region includes metal layers for anode and cathode contacts and corresponding bond pads, respectively. In this configuration, capacitive coupling occurs between the metal layers and/or active regions of the diode. Generally, capacitive coupling may be reduced by increasing isolation between the various layers. Low levels of capacitance are desired in certain applications for diodes in RF circuits because RF circuits are negatively impacted by losses in the system. Thus, reduction of capacitance generally reduces signal and power loss.

A number of conventional methods used to reduce capacitance coupling in semiconductor diodes include additional fabrication steps, as well as increase process and fabrication costs and potentially impact other DC or RF performance parameters, while only marginally effecting capacitance. Conventional methods to create low capacitance diodes include use of air bridges, as described by Tan et. al., 120-*GHz Long-Wavelength Low-Capacitance Photodetector with an Air-Bridged Coplanar Metal Waveguide*, IEEE PHOTONICS TECHNOLOGY LETTERS, Vol. 7, No. 12, pp. 1477-1479 (December 1995), or mesas, as described by Bishop et. al., *A Micron-Thickness, Planar Schottky Diode Chip for Terahertz Applications with Theoretical Minimum Parasitic Capacitance*, IEEE MTT-S DIGEST, pp. 1305-1308 (1990), for example. The added costs of such methods can limit applicability in instances where manufacturing costs must be minimized, as in the case of packageless discrete diodes. In addition, structures such as mesas, which aid in capacitance reduction, planarization and scratch resistance can be an issue. One method to overcome these requirements is through planarization with a spin-on material or coating specifically designed for electronic device passivation.

SUMMARY

In a representative embodiment, a semiconductor device includes a diode, a passivation layer and a conductive layer. The diode includes an epitaxial layer on a semiconductor substrate, and first and second diode contacts on different planes. The passivation layer has a planar top surface, and includes multiple consecutive layers of a benzocyclobutene (BCB) material formed on the diode. An aggregate thickness of the passivation layer exceeds a thickness of the epitaxial layer. The conductive layer is formed on the top surface of passivation layer, the conductive layer connecting with the first and the second diodes contact through first and second openings in the passivation layer, respectively. The passivation layer enhances a capacitive isolation between the conductive layer and the diode.

In another representative embodiment, a semiconductor diode device includes an epitaxial layer on a semiconductor substrate, a first passivation layer on the epitaxial layer, an anode contact on the epitaxial layer and a cathode contact on the semiconductor substrate. The semiconductor device further includes a second passivation layer having a planar top surface, the second passivation layer having multiple consecutive layers of a low-k dielectric material formed on the epitaxial layer. An aggregate thickness of the second passivation layer exceeds a thickness of the epitaxial layer. An anode bond pad is formed on the top surface of second passivation layer, the anode bond pad connecting with the anode contact through a first opening in the second passivation layer. A cathode bond pad is formed on the top surface of second passivation layer, the cathode bond pad connecting with the cathode contact through a second opening in the second passivation layer, the cathode bond pad being on substantially the same plane as the anode bond pad.

In another representative embodiment, a semiconductor diode device includes a semiconductor substrate, anode and cathode contacts and anode and cathode bond pads. The semiconductor substrate defines a pit filled with a low-k dielectric material. The anode contact is on the semiconductor substrate adjacent the pit, and the cathode contact is on the semiconductor substrate adjacent the anode contact. The anode bond pad connects with the anode contact through a first opening in a passivation layer, the anode bond pad including an extended portion extending over a surface of the low-k dielectric material in the pit. The cathode bond pad connects with the cathode contact through a second opening in the passivation layer, the cathode bond pad being on substantially the same plane as the anode bond pad.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
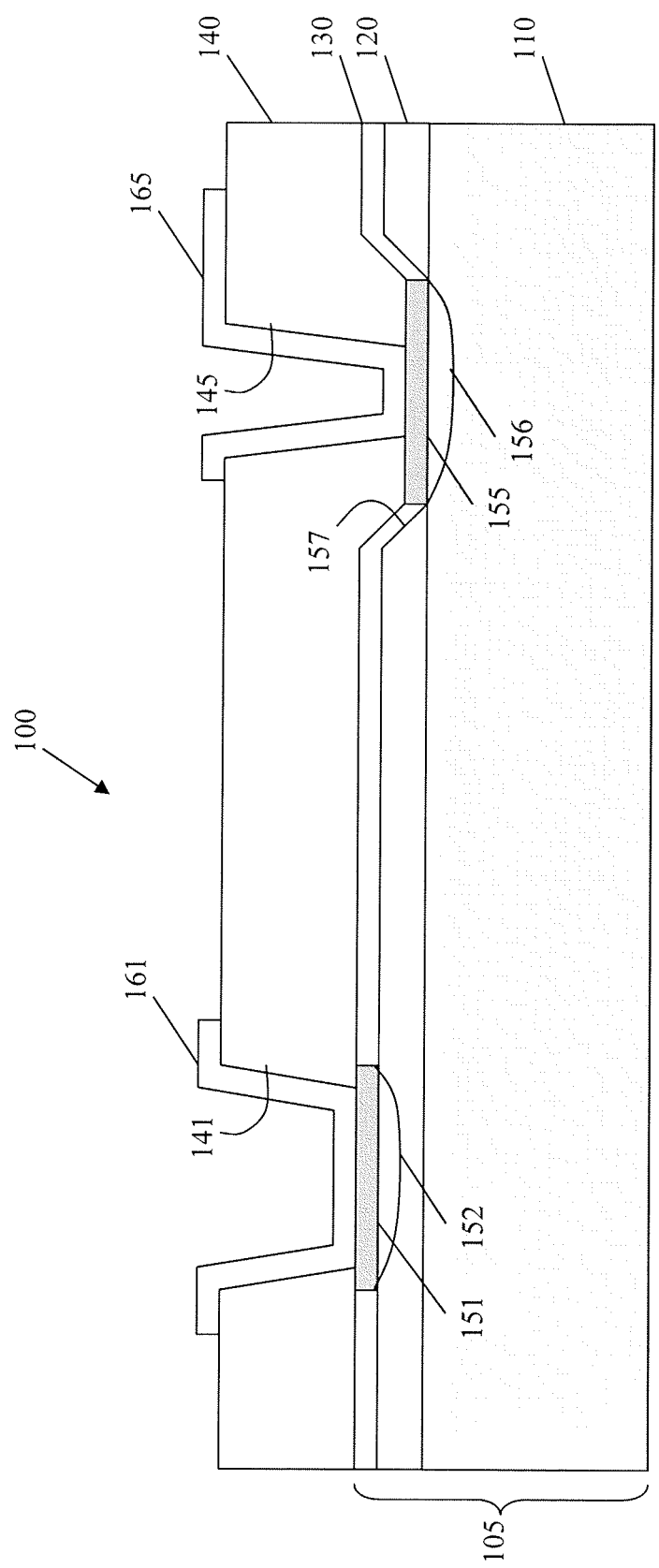
FIG. 1 is a cross-sectional diagram illustrating a semiconductor device, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

According to various embodiments, a top passivation layer formed of a material having a low dielectric constant k (i.e., low-k dielectric material) is positioned below a metallization layer (e.g., anode and cathode bond pads of a diode) on a semiconductor device. For purposes of explanation, a low-k dielectric material is a material having a dielectric constant value of about 3.9 or less, such as a polymide or benzocyclobutene (BCB) (e.g., Cyclotene™), examples of which are described by T. M. Stokich, Jr., et al., *Planarization with Cyclotene™ 3022 (BCB) Polymer Coatings*, MAT. RES. SOC. SYMP. PROC., Vol. 308, pp. 517-526 (1993), the subject matter of which is hereby incorporated by reference. The low-k dielectric material provides interlayer dielectric for electrical isolation, planarization, adhesion, moisture protection and mechanical protection, as well as passivation. In addition, according to various embodiments, the low-k dielectric material reduces capacitance between any conductive layers on top of the low-k dielectric material and the circuitry or electrically active regions below it. BCB, in particular, used in devices operating in the RF regime provide additional electrical isolation, as compared to conventional passivation layer materials, such as oxides, nitrides or oxynitrides. The increased isolation is enabled, in part, by the low dielectric constant and the thickness of the top passivation layer.

FIG. 1 is a cross-sectional diagram illustrating a semiconductor device, according to a representative embodiment.

Referring to FIG. 1, semiconductor diode device 100 includes a diode 105 having an intrinsic epitaxial layer 120 and a first passivation layer 130 formed on semiconductor substrate 110. The epitaxial layer 120 may be formed of silicon, gallium nitride (GaN), gallium arsenide (GaAs) or the like. The first passivation layer 130 may include an oxide layer, such as silicon dioxide, and a nitride layer, such as silicon nitride or combination. The substrate 110 may be formed of any semiconductor material compatible with semiconductor processes, such as silicon, GaAs, indium phosphide (InP) or the like. For simplicity, some of the minor topology associated with the various oxides and nitride layers of the first passivation layer 130 is not shown.

FIG. 1 depicts a p-type-intrinsic-n-type (PIN) diode, for purposes of explanation, but various embodiments may include other types of diodes, such as a Schottky diode using an appropriately doped epitaxial layer, for example. The diode device 100 further includes anode contact 151 and cathode contact 155, corresponding to the anode and cathode of the diode 105, arranged in a substantially horizontal configuration. The anode contact 151 is formed on the surface of the epitaxial layer 120 over diffused p-doped region 152. The cathode contact 155 is formed in trench or contact via 157, which extends through the epitaxial layer 120, on the surface of the substrate 110 over diffused n-doped region 156. A PN junction is formed in a depletion region between the anode contact 151 and the cathode contact 155. The anode contact 151 and the cathode contact 155 may be formed of a conductive material compatible with semiconductor processes, such as platinum silicide, tungsten, molybdenum, aluminum or the like. Of course, in various configurations, the anode and cathode contacts and corresponding diffused doped regions may be reversed, such that contacts 151 and 155 are the cathode and anode contacts, respectively, and the corresponding diffused doped regions 152 and 156 are the n-type and p-type doped regions, respectively, without departing from the scope of the present teachings.

A second passivation layer 140 is included as a top passivation layer on the top surfaces of the first passivation layer 130, the anode contact 151 and the cathode contact 155. The second passivation layer 140 is formed of a material having a low dielectric constant, such as BCB, although the low-k dielectric material may alternatively be formed of any compatible material having electrical insulation and planarization characteristics similar to those of BCB, without departing from the scope of the present teachings. In various embodiments, the second passivation layer 140 is spun on, for example, and thus provides planarization of the top surface of the diode device 100. Alternatively, the low-k dielectric material of the second passivation layer 140 may be applied using methods other than spin on, such as plasma enhanced chemical vapor deposition (PECVD), for example. A planarized or planar surface is substantially flat and thus can be used for additional circuitry or metallization for wiring, interconnects, bond pads or the like.

The second passivation layer 140 includes first and second openings 141 and 145, which extend through the second passivation layer 140 to expose the anode contact 151 and the cathode contact 155, respectively. Anode bond pad 161 connects with the anode contact 151 through the first opening 141, and cathode bond pad 165 connects with the cathode contact 155 through the second opening 145. In the depicted configuration, the anode and cathode bond pads 161 and 165 are coplanar, and thus may be used, for example, in flip-chip bonding the diode 100 to the circuit in which is it used. The anode and cathode bond pads 161 and 165 may be formed of a conductive material compatible with semiconductor processes, such as gold, a gold-tin alloy, or a multilayer metallization as required by the bonding method, or the like.

In order to enhance electrical isolation, the second passivation layer 140 is substantially thicker than the combined epitaxial layer 120 and first passivation layer 130 (e.g., by about 30-50 percent), and also substantially thicker than BCB layers used in conventional applications (e.g., by about 50-100 percent). For example, the combined epitaxial layer 120 and first passivation layer 130 (and thus the depth of the contact via 157) may be about 12-14 µm, while the second passivation layer 140 may be about 16-22 µm. In various embodiments, the depth of the contact via 157 may be about 2000 Å to about 10 um with the first passivation layer 130 having a thickness of about 10-16 µm, depending on the thickness of the epitaxial layer 120. In various embodiments, multiple consecutive layers of low-k dielectric material are applied in order to obtain the requisite thickness of the second passivation layer 140. Of course, the thicknesses of the epitaxial layer 120, the first passivation layer 130 and the second passivation layer 140 may vary to provide unique benefits for any particular situation or to meet application specific design requirements of various implementations, as would be apparent to one skilled in the art.

Generally, the second passivation layer 140 provides enhanced capacitive isolation, and thus reduced levels of capacitive coupling, between the relatively large anode and cathode bond pads 161, 165 and various electrically active regions of the discrete diode 105, such as the anode and cathode contacts 151, 155, the epitaxial layer 120 and the diffused doped regions 152, 156. This enables the diode device 100 to have lower capacitance than would be possible without the second passivation layer 140, as described above.

Figure 2:
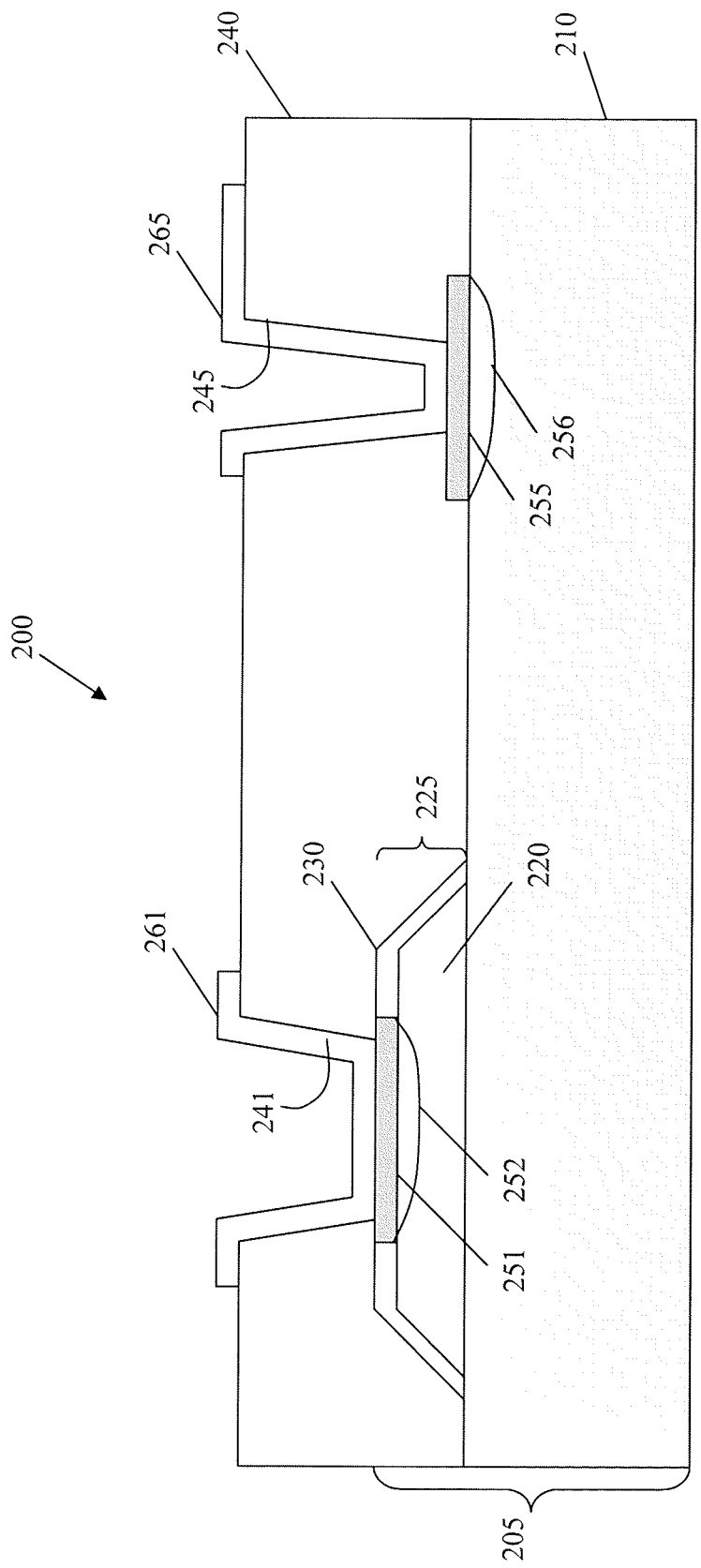
FIG. 2 is a cross-sectional diagram illustrating a semiconductor device, according to a representative embodiment.

FIG. 2 is a cross-sectional diagram illustrating a semiconductor device, according to another representative embodiment.

Referring to FIG. 2, semiconductor diode device 200 includes a diode 205 having an intrinsic epitaxial layer 220 and a first passivation layer 230 formed in a mesa 225 on semiconductor substrate 210. As would be apparent to one of ordinary skill in the art, the epitaxial layer 220, the first passivation layer 230 and the semiconductor substrate 210 may be formed of the same materials as the epitaxial layer 120, the first passivation layer 130 and the semiconductor substrate 110, respectively, discussed above with reference to FIG. 1.

The diode device 200 further includes anode contact 251 and cathode contact 255, corresponding to the anode and cathode of the diode 205, arranged in a substantially horizontal configuration. The anode contact 251 is formed on the surface of the epitaxial layer 220 over diffused p-doped region 252 in the mesa 225, and the cathode contact 255 is formed on the surface of the substrate 210 over diffused n-doped region 256, forming a depletion region in between. As discussed above with reference to FIG. 1, the anode and cathode and corresponding diffused doped regions may be reversed, in various configurations, without departing from the scope of the present teachings. Also, one or both of the anode and cathode contacts may be formed on an undiffused region, depending on the desired characteristics of the diode.

A second passivation layer 240 is included as a top passivation layer on the top surfaces of the first passivation layer 230, the anode contact 251 and the cathode contact 255. The second passivation layer 240 is formed of a material having a low dielectric constant, such as BCB, although the low-k dielectric material may alternatively be formed of any compatible material having electrical insulation and planarization characteristics similar to those of BCB, without departing from the scope of the present teachings. In various embodiments, the second passivation layer 240 is spun on, for example, and thus provides a planarized top surface of the diode device 200 over the mesa 225. As stated above, any alternate method of application, such as PECVD, may be used to apply the second passivation layer 240, which may then be planarized in subsequent process steps, such as photomasking and etchback or chemical mechanical polishing, for example. A planarized surface is substantially flat and thus can be used for additional circuitry or metallization for wiring, interconnects, bond pads or the like.

The second passivation layer 240 includes first and second openings 241 and 245, which extend through the second passivation layer 240 to expose the anode contact 251 and the cathode contact 255, respectively. Anode bond pad 261 connects with the anode contact 251 through the first opening 241, and cathode bond pad 265 connects with the cathode contact 255 through the second opening 245. In the depicted configuration, the anode and cathode bond pads 261 and 265 may be used, for example, in flip-chip bonding the planar diode 200 to the circuit in which is it used.

As would be apparent to one of ordinary skill in the art, the anode and cathode contacts 251, 255 and the anode and cathode bond pads 261, 265 may be formed of the same materials as the anode and cathode contacts 151, 155 and the anode and cathode bond pads 161, 165, respectively, discussed above with reference to FIG. 1. Likewise, the second passivation layer 240 is substantially thicker than the combined epitaxial layer 220 and passivation layer 230 (e.g., by about 30-50 percent), and also substantially thicker than BCB layers used in conventional applications (e.g., by about 50-100 percent), and may be formed in the same representative dimensions and provide the same benefits as the second passivation layer 140, as discussed above with reference to FIG. 1.

Use of a low-k dielectric material (such as BCB) as a top passivation layer as shown in FIGS. 1 and 2, is not limited to diode devices, and may be included in other semiconductor devices e.g., for electrical isolation, planarization, adhesion, mechanical and moisture protection, and improved capacitance characteristics. Also, as stated above, BCB is one example of a low-k dielectric material for planarizing the surface of the diode device 100, 200 and for reducing capacitance. As compared to BCB, standard oxides that may be used to help planarize an electronic device are typically limited to a few microns in thickness, so they are not cost effective to use in the case of features that have significant height variation, as discussed above with reference to FIGS. 1 and 2. Many oxides also have dielectric constants that are typically higher than low-k dielectric materials, such as BCB, used in the depicted embodiments. Therefore, while a typical oxide stack coupled with nitride and/or oxynitride may provide scratch protection, for example, they are not normally suitable for obtaining good electrical isolation and/or capacitance in RF circuits.

The semiconductor devices of the various representative embodiments (e.g., diode devices 100 and 200) may be fabricated in accordance with various techniques compatible with semiconductor processes. A non-limiting example of a fabrication process directed to diode device 100 depicted in FIG. 1 is provided by FIGS. 3A-3F, according to various embodiments. It is understood that all or part of the process depicted in FIGS. 3A-3F may be applied to the fabrication of other configurations of semiconductor devices, such as diode device 200.

Figure 3A:
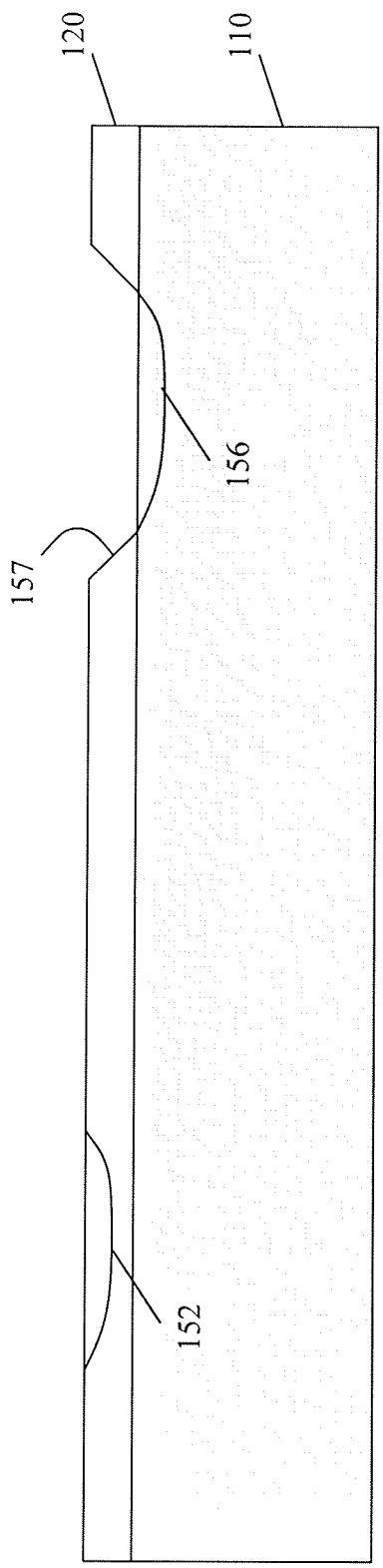
FIGS. 3A-3F are cross-sectional diagrams illustrating steps in a fabrication process of a semiconductor device, according to a representative embodiment.

Referring to FIG. 3A, epitaxial layer 120 is formed (or grown) on semiconductor substrate 110. The epitaxial layer 120 may be about 13 μm thick, for example, although the thickness may vary to provide unique benefits for any particular situation or to meet application specific design requirements of various implementations, as would be apparent to one skilled in the art. The epitaxial layer 120 may be formed of Si, GaN, GaAs or the like, and the semiconductor substrate 110 may be formed of Si, GaAs, InP, or the like, or any other semiconductor materials compatible with semiconductor processes.

Trench or contact via 157 is formed through the epitaxial layer 120 to expose the surface of the semiconductor substrate 110. The sidewalls of the contact via 157 may be substantially vertical or may have positive slopes, as shown in FIG. 3A, for example. The contact via 157 may be formed using any compatible technique capable of forming an opening in the epitaxial layer 120, such as wet (or chemical) etching, dry etching, machining, ion milling, or the like, and may include photolithography. P-type impurities (not shown) are injected into the epitaxial layer 120 at the location of the anode to form diffused p-doped region 152, and n-type impurities (not shown) are injected into the semiconductor substrate 110 at the location of the cathode to form diffused n-doped region 156. According to various embodiments, there also may be a buried diffusion layer (not shown), or there may be no diffusions used for one or both of the contacts 151, 156.

Figure 3B:
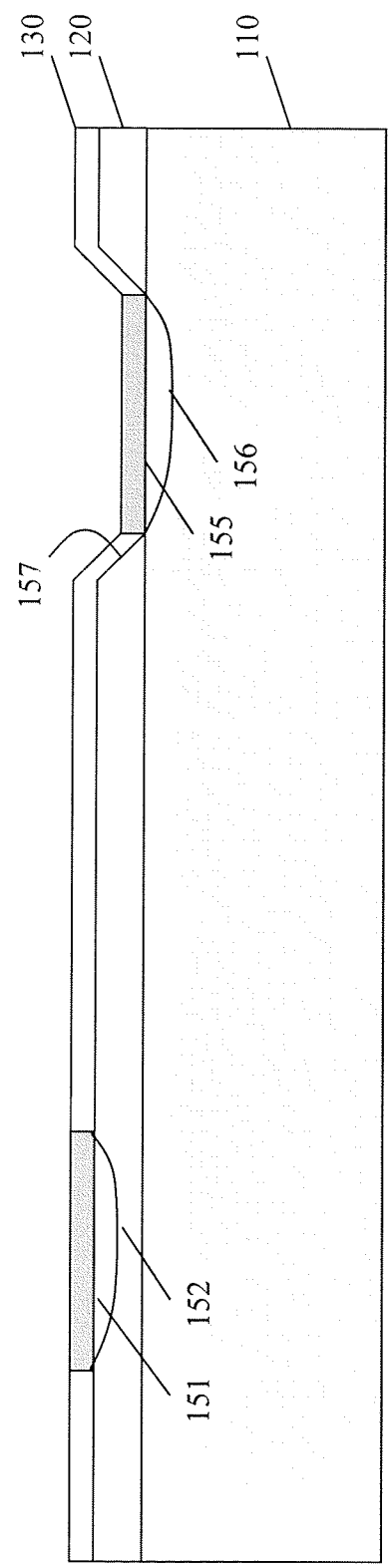

Referring to FIG. 3B, first passivation layer 130 is formed on epitaxial layer 120 prior to the trench or via formation. The first passivation layer 130 may include an oxide layer (not shown), such as silicon dioxide or the like, and a nitride layer (not shown), such as silicon nitride, oxynitride or the like, formed on the oxide layer. Also, anode contact 151 is formed on the epitaxial layer 120 above the diffused p-doped region 152 and cathode contact 155 is formed on the semiconductor substrate 110 above the diffused n-doped region 156.

The first passivation layer 130, as well as the anode and cathode contacts 151 and 155, may be formed using any fabrication techniques compatible with semiconductor processes, as would be apparent to one skilled in the art. For example, the first passivation layer 130 may be formed on the epitaxial layer 120, and then selectively etched over the diffused p-doped region 152 and the diffused n-doped region 156. A layer of conductive material, such as platinum silicide, tungsten, molybdenum, aluminum or the like, may then be formed over the etched first passivation layer 130, and then etched everywhere other than over the diffused p-doped region 152 and the diffused n-doped region 156, to the form the anode contact 152 and the cathode contact 155, respectively. The first passivation layer 130 may be about 1 μm thick and the anode and cathode contacts 151 and 155 may be about 2000 Å thick, for example, although the thicknesses may vary to provide unique benefits for any particular situation or to meet application specific design requirements of various implementations, as would be apparent to one skilled in the art.

Figure 3C:
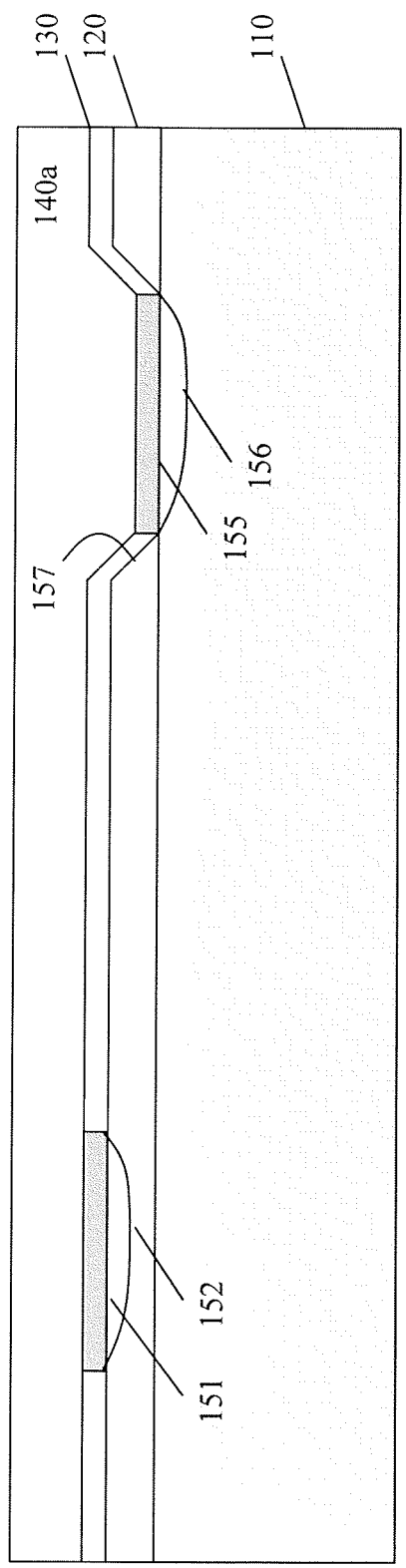
Figure 3D:
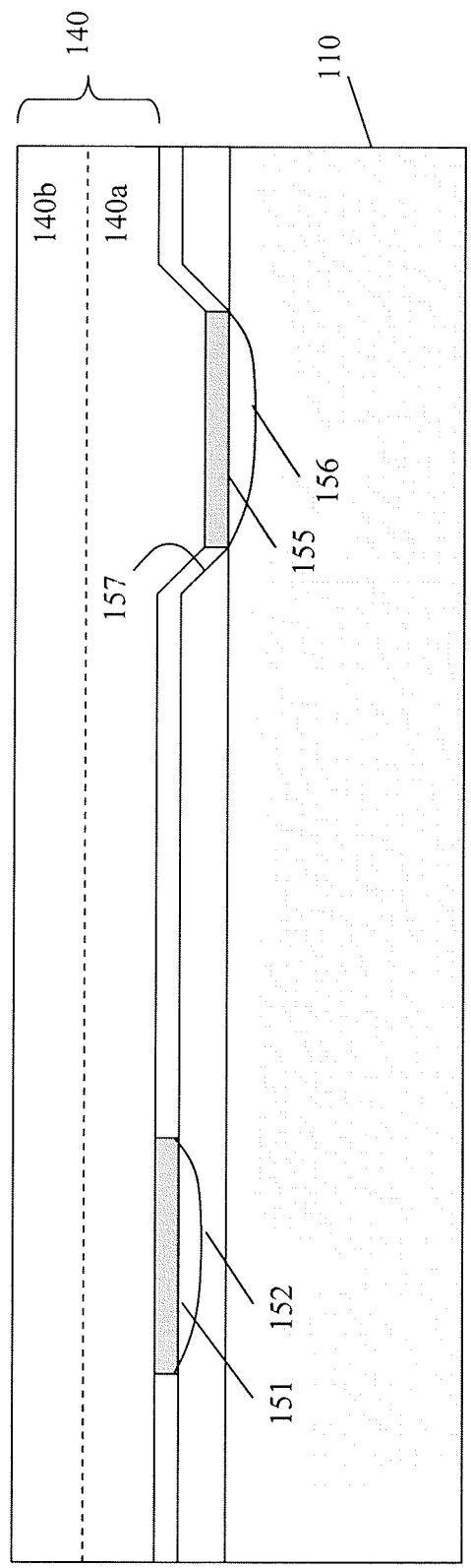

FIGS. 3C and 3D depict formation of the second passivation layer 140, which occurs in multiple application steps. For example, a first sub-layer 140a of a low-k dielectric material is applied to the first passivation layer 130 and the anode and cathode contacts 151 and 155, as shown in FIG. 3C, filling the contact via 157. As discussed above, the low-k dielectric material may be BCB, or any material having a low dielectric constant (e.g., about 3.9 or less) and planarization characteristics similar to those of BCB. The planarization may be performed on the low-k dielectric material in a subsequent process step. The first sub-layer 140a is spun on, for example, and at least partially planarizes the top surface. The partially formed diode device including the first sub-layer 140a is then baked, for example, at about 210° C. for about 40 minutes.

A second sub-layer 140b of the same low-k dielectric material is then applied to the top surface of the first sub-layer 140a, as shown in FIG. 3D. The second sub-layer 140b is spun on, for example, and thus provides a planarized top surface. The partially formed diode device including the first and second sub-layers 140a and 140b is again baked, for example, at about 250° C. for about 60 minutes. As a result, the first and second sub-layers 140a and 140b integrally form the second passivation layer 140, having a planarized top surface. As stated above, various embodiments may include low-k materials other than BCB, for example, such as fluorine or carbon doped $SiO_2$, porous $SiO_2$, porous carbon doped $SiO_2$, and other spin on organic polymeric dielectrics or spin on silicon based polymeric dielectrics. Additional planarization may be achieved, if needed, using subsequent process steps, such as photomasking and etch-back, mechanical planarization, or the like.

In various embodiments, at least one of the first and second sub-layers 140a and 140b has a thickness that is near the maximum thickness that can be attained in a single spin-on application. For example, assuming the low-k dielectric material is BCB, the maximum thickness attainable through a single spin-on application is about 10 μm, and thus one or both of the first and second sub-layers 140a and 140b may be about 10 μm. Accordingly, in the depicted representative embodiment, the maximum aggregate thickness of the second passivation layer of about 20 μm, assuming that each of the first and second sub-layers 140a and 140b is about 10 μm. Generally, the thicker the second passivation layer 140, the greater the suppression of capacitance, and thus the improvement of the capacitive isolation properties of the diode device 100. When the thickness of the second passivation layer 140 is about 20 μm and the contact via 157 is about 14 μm deep, for example, the total thickness of the low-k dielectric material above the cathode contact 155 is about 34 μm.

Of course, both of the first and second sub-layers 140a and 140b may have respective thicknesses less than the maximum thickness attainable through a single spin-on application, without departing from the scope of the present teachings, although the aggregate thickness would still exceed the maximum thickness attainable through a single spin-on application. Further, in various embodiments, additional sub-layers may be included on the first and second sub-layers 140a and 140b to provide a greater aggregate thickness of the second passivation layer 140, e.g., by repeating the spin-on and subsequent baking processes discussed above. Also, in various embodiments, the first and second sub-layers 140a and 140b may include different low-k dielectric materials, without departing from the scope of the present teachings.

Figure 3E:
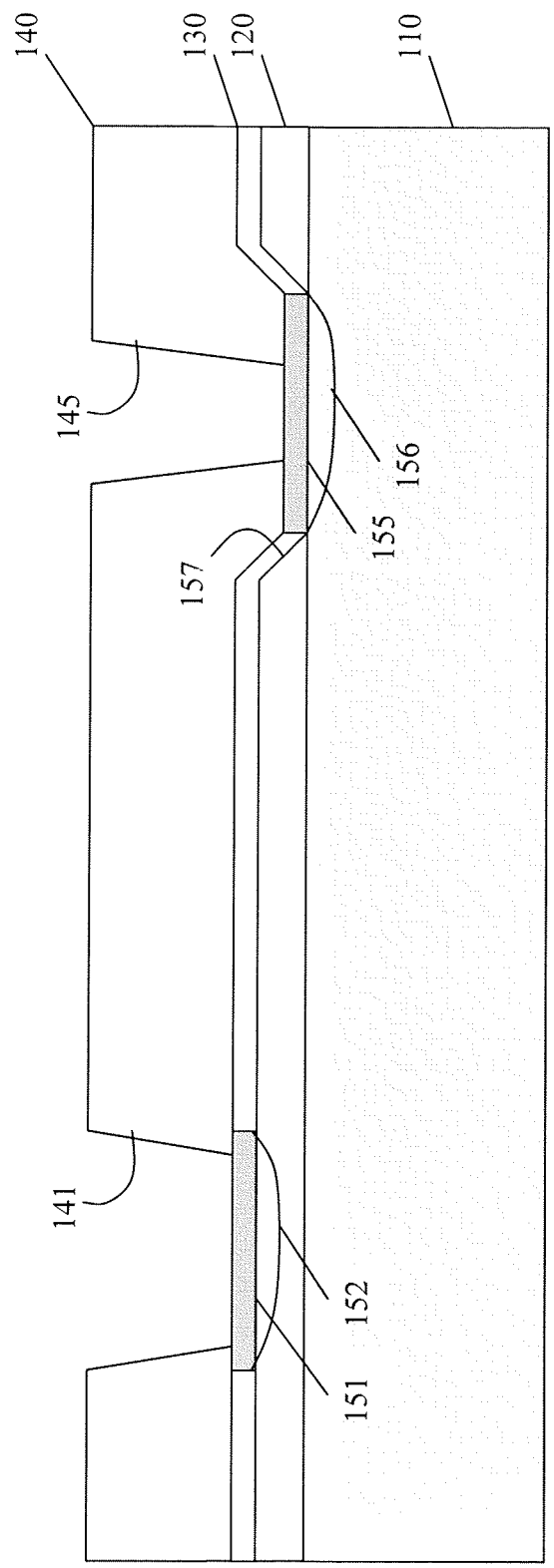

Referring to FIG. 3E, first opening 141 is formed through the second passivation layer 140, exposing at least a portion of the anode contact 151, and second opening 145 is formed through the second passivation layer 140, exposing at least a portion of the cathode contact 155. According to various embodiments, a wet or dry etching process may be used to form the first and second openings 141 and 145 in the second passivation layer 140. For example, a metal may be applied and patterned using a photomask to create openings corresponding to the first and second openings 141 and 145, which are then etched using a dry etcher. Alternatively, the first and second openings 141 and 145 may be formed from a photomask process with photo developer or other wet chemical etching the holes. After the etching is complete, the metal mask is removed, leaving a completely planar surface on the second passivation layer 140 with the first and second openings 141 and 145 down to the anode and cathode contacts 151 and 155, e.g., on top of the diode 105. Of course, other masking and etching techniques compatible with semiconductor processes may be incorporated without departing from the scope of the present teachings.

Figure 3F:
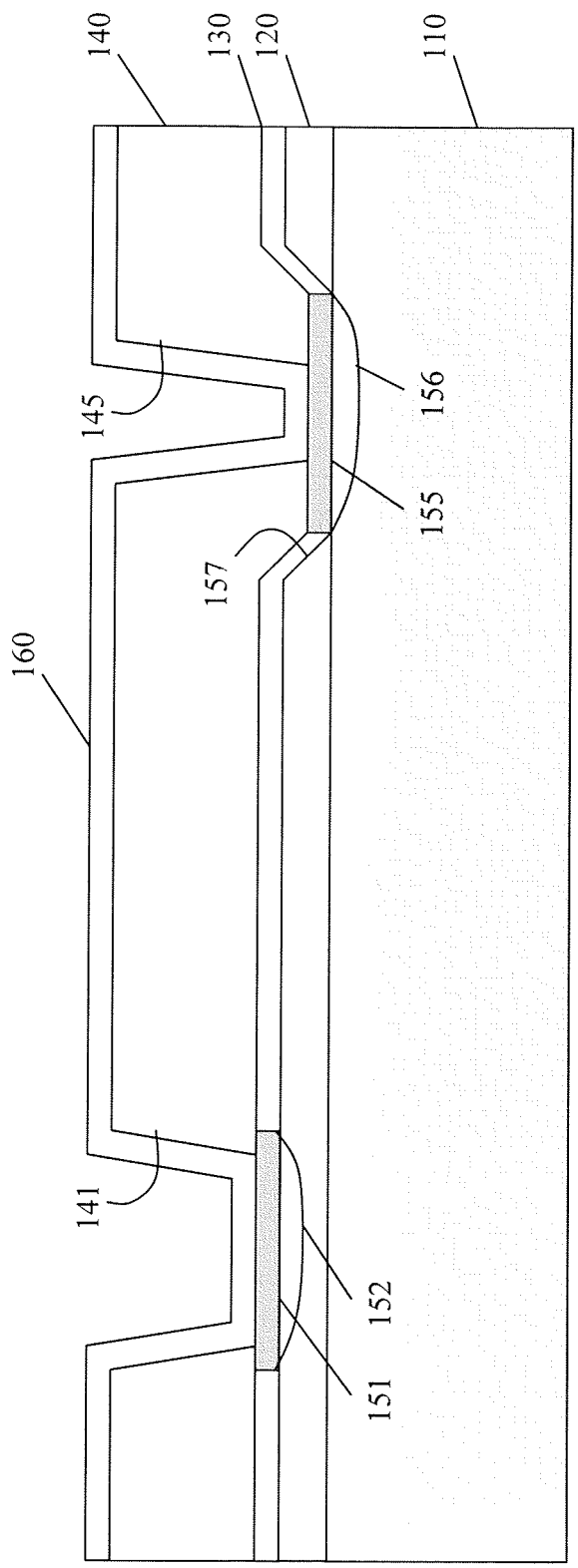

Referring FIG. 3F, a metal layer 160 is applied, covering the top surface of the second passivation layer 140, as well as the side walls of the first and second openings 141 and 145 and the corresponding exposed portions of the anode and cathode contacts 151 and 155. The metal layer 160 is patterned to create the anode bond pad 161 and cathode bond pad 165, as shown in FIG. 1, as well as the conductive paths between the anode and cathode bond pads 161 and 165 and the anode and cathode contacts 151 and 155 at the bottom of the first and second openings 141 and 145, respectively. For example, the patterning may be performed using photolithography, although various alternative techniques may be incorporated. That is, the metal layer 160 is photomasked, followed by metal etching to etch away metal that is not part of the anode and cathode bonding pads 161 and 165, or is not part of the conductive paths between the bond pads 161 and 165 and sidewalls of the first and second openings 141 and 145, or down the sidewalls of the first and second openings 141 and 145. The planar diode device 100 may then be thinned, if required, to a predetermined dimension (e.g. about 8 mils).

Referring again to FIG. 1, the anode and cathode bonding pads 161 and 165 are coplanar as a result of the planarity of the second passivation layer 140, even though there is significant topological variation below the second passivation layer 140. Having the anode and cathode bond pads 161 and 165 on the same plane aids in solder bonding or otherwise connecting the planar diode device 100 onto a circuit board or similar application. Also, the coplanar configuration may eliminate the need for packaging, although this may require an additional hermetic layer, such as a nitride layer, for example. Generally, though, the second passivation layer 140 provides a protective cover for the diode 105, including moisture and mechanical protection, as well as protection against other environmental factors.

Figure 4:
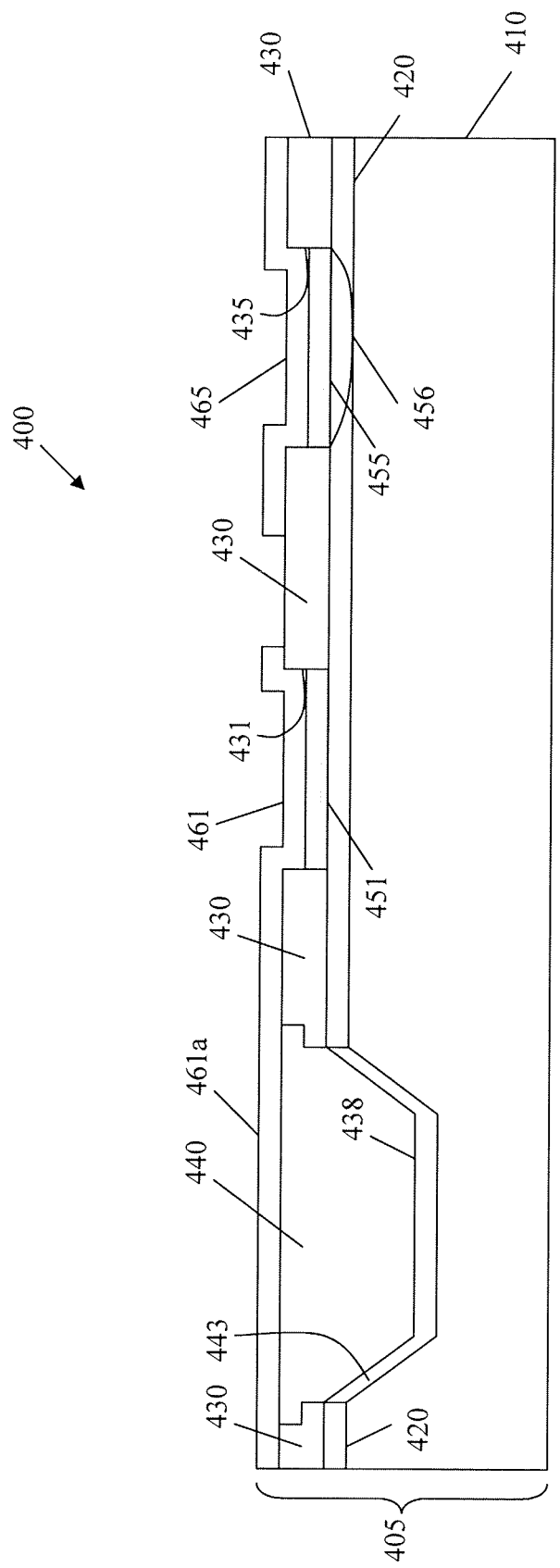
FIG. 4 is a cross-sectional diagram illustrating a semiconductor device, according to a representative embodiment.
Figure 5:
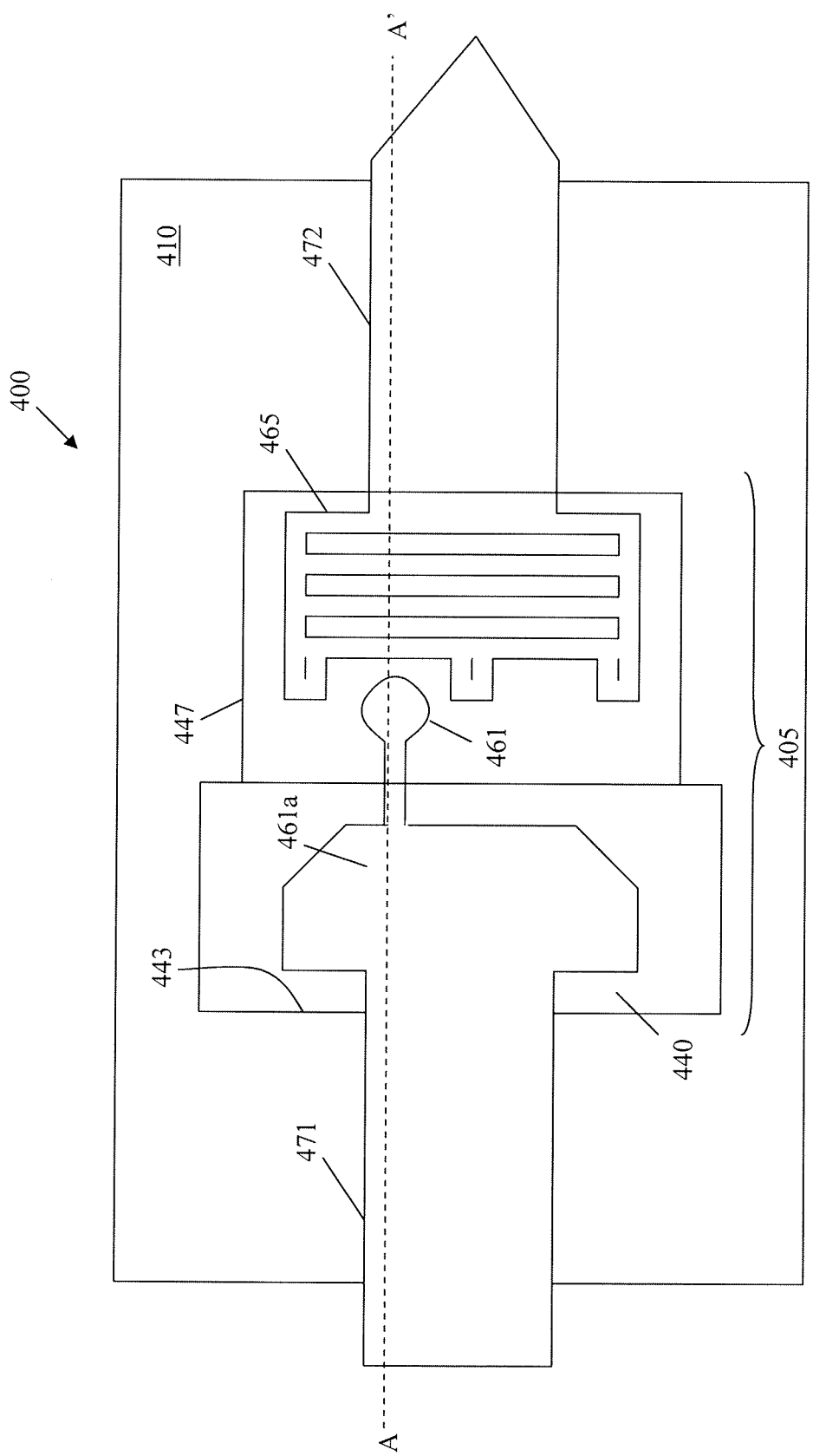
FIG. 5 is a top plan view of the semiconductor device of FIG. 4, according to a representative embodiment.

FIG. 4 is a cross-sectional diagram illustrating a semiconductor device, according to a representative embodiment, and FIG. 5 is a top plan view of the semiconductor device of FIG. 4, according to a representative embodiment. More particularly, FIG. 4 is a cross-sectional diagram of semiconductor diode device 400 taken along line A-A' shown in FIG. 5.

Referring to FIGS. 4 and 5, the diode device 400 includes diode 405 having a thin intrinsic, p-doped or n-doped epitaxial layer 420 and passivation layer 430 formed on semiconductor substrate 410. The epitaxial layer 420 may be formed of Si, GaN, GaAs, or the like. The passivation layer 430 may include one or more oxide layers, such as silicon dioxide, and one or more nitride layers, such as silicon nitride or oxynitride. The semiconductor substrate 410 may be formed of any semiconductor material compatible with semiconductor processes, such as Si, GaAs, InP or the like.

The diode device 400 further includes anode contact 451 and cathode contact 455, arranged in a substantially horizontal configuration. Also, in an embodiment, the anode contact 451 and cathode contact 455 may be on substantially the same plane. The anode contact 451 is formed on the epitaxial layer 420 over an undiffused region and the cathode contact 455 is formed on the epitaxial layer 420 over diffused n-doped region 456. As discussed above, in various configurations, one or both of the contacts 451 and 455 may not be formed over a diffused region, depending on the required diode characteristics. A Schottky junction is formed in a metal to epitaxial region at the anode contact 451. The anode contact 451 and the cathode contact 455 may be formed of a conductive material compatible with semiconductor processes, such as platinum silicide, tungsten, molybdenum, aluminum or the like, and may be an alloy of Si and metal. Of course, in various configurations, the anode and cathode contacts and corresponding diffused doped region may be reversed, such that contacts 451 and 455 are the cathode and anode contacts, respectively, and the diffused doped region 456 is a p-type doped region, without departing from the scope of the present teachings.

In the depicted embodiment, a pit 443 formed in the silicon semiconductor substrate 410 is filled with a material having a low dielectric constant, such as BCB, to form low-k dielectric material region 440. The sidewalls of the pit 443 may be substantially vertical or may have positive slopes, as shown in FIG. 4, for example. The pit 443 may be formed using any compatible technique capable of forming an opening in the semiconductor substrate 410, such as wet (or chemical) etching, dry etching, machining, ion milling, or the like, and may include photolithography. As discussed above, the low-k dielectric material may alternatively be formed of any compatible material having electrical insulation and planarization characteristics similar to those of BCB or be planarized through subsequent processing, without departing from the scope of the present teachings. In various embodiments, the low-k dielectric material region 440 is spun on, for example, and thus provides planarization of the top surface of the diode device 400.

In an embodiment, an oxide layer 438 lines the bottom of the pit 443, although various other materials may be incorporated.

Anode bond pad 461 connects with the anode contact 451 through a first opening 431 in the passivation layer(s) 430, and cathode bond pad 465 connects with the cathode contact 455 through a second opening 435 in the passivation layer(s) 430. The anode bond pad 461 includes an extended portion 461a that extends across the planarized top surface of the low-k dielectric material region 440. As shown in FIG. 5, the extended portion 461a has a large surface area, as compared to the portion of the anode bond pad 461 contacting the anode contact 451. However, the capacitive effects of the extended portion 461a are reduced by the low-k dielectric material region 440. Also as shown in FIG. 5, the extended portion 461a of the anode bond pad 461 and the cathode bond pad 465 connect with beams 471 and 472, respectively, which extend beyond the active regions of the diode 405, e.g., for connecting with additional circuitry. In the depicted configuration, the anode and cathode bond pads 461 and 465 may be used, for example, in solder bonding the diode device 400 to the circuit in which is it used. The anode and cathode bond pads 461 and 465 and the beams 471 and 472 may be formed of a conductive material compatible with semiconductor processes, such as gold, a gold-tin alloy or the like.

In order to enhance electrical isolation, the low-k dielectric material region 440 is substantially thicker than the combined epitaxial layer 420 and the passivation layer 430 (e.g., by about 30-100 percent). For example, the combined epitaxial layer 420 and first passivation layer 430 may be about 1-2 μm, while the low-k dielectric material region 440 may be about 16-30 μm. In various embodiments, multiple consecutive layers of the low-k dielectric material are applied in order to obtain the requisite thickness of the low-k dielectric material region 440, as discussed above with respect to second passivation layers 140 and 240 in FIGS. 1 and 2. Of course, the thicknesses of the epitaxial layer 420, the passivation layer 430 and the low-k dielectric material region 440 may vary to provide unique benefits for any particular situation or to meet application specific design requirements of various implementations, as would be apparent to one skilled in the art.

Generally, the low-k dielectric material region 440 provides enhanced capacitive isolation, and thus reduced levels of capacitive coupling, between the relatively large anode and cathode bond pads 461, 465 and various electrically active regions of the discrete diode 405, such as the anode and cathode contacts 451, 455, the epitaxial layer 420 and the respective metal to semiconductor contacts. This enables the diode device 400 to have lower capacitance than would be possible without the low-k dielectric material region 440.

In the depicted embodiment, the low-k dielectric material is used to fill and planarize the area of the diode device 400 in and around the pit 443. In addition, as shown in FIG. 5, a low-k dielectric material coating 447 may be applied over portions of the anode and cathode bond pads 461 and 465, covering the active regions of the diode 405. The coating 447 provides moisture and mechanical protection, as well as protection against other environmental factors. FIG. 5 also illustrates the use of the low-k dielectric material region 440 to provide electrical isolation between the large extended portion 461a over the pit 443 and the anode contact 461. The largest metal area, e.g., the extended portion 461a, is over the low-k dielectric material region 440, and only a small trace extends from the extended portion 461a to the portion of the anode bond pad 461 connecting with the anode contact 451.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A semiconductor device, comprising:
   a diode comprising an epitaxial layer on a semiconductor substrate, and first and second diode contacts on different planes;
   a passivation layer having a planar top surface, the passivation layer comprising a first sub-layer of a benzocyclobutene (BCB) material formed on the diode and a second sub-layer of BCB material formed on the first sub-layer with no intervening layer, an aggregate thickness of the passivation layer exceeding a thickness of the epitaxial layer; and
   a conductive layer formed on the top surface of passivation layer, the conductive layer connecting with the first and second diode contacts through first and second openings in the passivation layer, respectively,
   wherein the passivation layer provides a capacitive isolation between the conductive layer and the diode.

2. The semiconductor device of claim 1, wherein the different planes of the first diode contact and the second diode are separated by at least the thickness of the epitaxial layer.

3. The semiconductor device of claim 1, wherein the first diode contact is formed on the epitaxial layer and the second diode contact is formed on the semiconductor substrate, the conductive layer connecting with the second diode contact through the second opening in the passivation layer and a via in the epitaxial layer.

4. The semiconductor device of claim 3, wherein a portion of the via in the epitaxial layer is filled with the BCB material.

5. The semiconductor device of claim 3, wherein the conductive layer comprises a first bond pad connecting with the first diode contact through the first opening in the passivation layer, and a second bond pad connecting with the second diode contact through the second opening in the passivation layer and the via in the epitaxial layer.

6. The semiconductor device of claim 1, wherein the epitaxial layer is included in a mesa formed on the substrate, and
   wherein the first diode contact is formed on a top surface of the mesa and the second diode contact is formed on the semiconductor substrate.

7. The semiconductor device of claim 6, wherein the conductive layer comprises a first bond pad connecting with the first diode contact through the first opening in the passivation layer, and a second bond pad connecting with the second diode contact through the second opening in the passivation layer.

8. The semiconductor device of claim 1, wherein the aggregate thickness of the passivation layer is greater than a maximum possible thickness of a single layer of the BCB material applied using a spin-on application.

9. The semiconductor device of claim 1, wherein the aggregate thickness of the passivation layer is greater than about 10 µm.

10. The semiconductor device of claim 1, wherein the conductive layer comprises a plurality of co-planar bond pads respectively connected to the first diode contact and the second diode contact.

11. The semiconductor device of claim 10, wherein the semiconductor device is configured for flip-chip bonding to an electrical circuit through the plurality of bond pads.

12. The semiconductor device of claim 10, wherein the first diode contact is an anode contact, and the second diode contact is a cathode contact.

13. The semiconductor device of claim 10, wherein the first diode contact is a cathode contact, and the second diode contact is an anode contact.

14. A semiconductor diode device, comprising:
   an epitaxial layer on a semiconductor substrate;
   a first passivation layer on the epitaxial layer;
   an anode contact on the epitaxial layer;
   a cathode contact on the semiconductor substrate;
   a second passivation layer having a planar top surface, the second passivation layer comprising multiple consecutive sub-layers of a low-k dielectric material formed on the epitaxial layer, with no intervening layer between the consecutive sub-layers, an aggregate thickness of the second passivation layer exceeding a thickness of the epitaxial layer;
   an anode bond pad on the top surface of second passivation layer, the anode bond pad connecting with the anode contact through a first opening in the second passivation layer; and
   a cathode bond pad on the top surface of second passivation layer, the cathode bond pad connecting with the cathode contact through a second opening in the second passivation layer, the cathode bond pad being on substantially the same plane as the anode bond pad.

15. The semiconductor diode device of claim 14, wherein the low-k dielectric material comprises benzocyclobutene (BCB).

16. The semiconductor diode device of claim 14, wherein the aggregate thickness of the second passivation layer is greater than about 10 µm.

17. The semiconductor diode device of claim 14, wherein the epitaxial layer is included in a mesa formed on the semiconductor substrate, and the anode contact is formed on a top surface of the mesa.

18. A semiconductor diode device, comprising:
   a semiconductor substrate defining a pit filled with a low-k dielectric material;
   an anode contact on the semiconductor substrate adjacent the pit;
   a cathode contact on the semiconductor substrate adjacent the anode contact;
   an anode bond pad connecting with the anode contact through a first opening in a passivation layer, the anode bond pad comprising an extended portion extending over a surface of the low-k dielectric material in the pit; and
   a cathode bond pad connecting with the cathode contact through a second opening in the passivation layer, the cathode bond pad being on substantially the same plane as the anode bond pad.

19. The semiconductor diode device of claim 18, wherein the low-k dielectric material comprises benzocyclobutene (BCB).

20. The semiconductor diode device of claim 18, further comprising:
   a coating of the low-k dielectric material covering at least a portion of the anode bond pad and the cathode bond pad over an active region of the semiconductor diode device.

* * * * *